United States Patent
Myodo et al.

(10) Patent No.: US 10,738,187 B2
(45) Date of Patent: Aug. 11, 2020

(54) RESIN COMPOSITION AND SEMICONDUCTOR DEVICE

(71) Applicant: NAMICS CORPORATION, Niigata (JP)

(72) Inventors: Hiroki Myodo, Niigata (JP); Toyokazu Hotchi, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 16/086,982

(22) PCT Filed: Mar. 30, 2017

(86) PCT No.: PCT/JP2017/013275
§ 371 (c)(1),
(2) Date: Sep. 20, 2018

(87) PCT Pub. No.: WO2017/170873
PCT Pub. Date: Oct. 5, 2017

(65) Prior Publication Data
US 2019/0100646 A1    Apr. 4, 2019

(30) Foreign Application Priority Data

Mar. 31, 2016  (JP) ................. 2016-070332

(51) Int. Cl.
| | |
|---|---|
| *C08L 33/08* | (2006.01) |
| *C08F 2/44* | (2006.01) |
| *C08K 3/36* | (2006.01) |
| *C08K 5/09* | (2006.01) |
| *C08L 33/04* | (2006.01) |
| *H01L 23/29* | (2006.01) |
| *H01L 23/31* | (2006.01) |
| *C08F 222/18* | (2006.01) |
| *C08F 236/06* | (2006.01) |

(52) U.S. Cl.
CPC ............. *C08L 33/08* (2013.01); *C08F 2/44* (2013.01); *C08K 3/36* (2013.01); *C08K 5/09* (2013.01); *C08L 33/04* (2013.01); *H01L 23/29* (2013.01); *H01L 23/293* (2013.01); *H01L 23/31* (2013.01); *C08F 222/18* (2013.01); *C08F 236/06* (2013.01); *C08L 2203/206* (2013.01)

(58) Field of Classification Search
CPC ... C08L 33/08; C08K 3/36; C08K 5/09; C08F 2/44
USPC ......................................................... 524/522
See application file for complete search history.

(56) References Cited

U.S. PATENT DOCUMENTS

| | | | |
|---|---|---|---|
| 2010/0278031 A1 | 11/2010 | Yamaguchi | |
| 2013/0078460 A1* | 3/2013 | Tasaka | C09D 5/1637 428/339 |
| 2013/0289166 A1 | 10/2013 | Makihara et al. | |
| 2016/0216804 A1* | 7/2016 | Kobayashi | B32B 27/36 |

FOREIGN PATENT DOCUMENTS

| | | |
|---|---|---|
| CN | 103339206 A | 10/2013 |
| JP | 2004168933 A | 6/2004 |
| JP | 2014033197 A | 2/2014 |
| JP | 2015002204 A | 1/2015 |
| JP | 2015017169 A | 1/2015 |
| JP | 2015019012 A | 1/2015 |
| JP | 2015078303 A | 4/2015 |
| WO | 2009063743 A1 | 5/2009 |
| WO | WO2015/046519 | * 4/2015 |

OTHER PUBLICATIONS

International Search Report dated Jun. 27, 2017 filed in PCT/JP2017/013275.
Taiwanese Office Action (TWOA) dated Feb. 27, 2020 for the corresponding Taiwanese Patent Application No. 106111077.

* cited by examiner

*Primary Examiner* — Deve V Hall
(74) *Attorney, Agent, or Firm* — Rankin, Hill & Clark LLP

(57) ABSTRACT

An object of the present invention is to provide a resin composition in which voids are suppressed during application, the voids and delamination are suppressed after reflow subsequent to mounting and a moisture absorption resistance test, and the delamination and change in resistance value after curing are suppressed, when used in a pre-supply type process. Provided is the resin composition containing (A) an acrylate compound or methacrylate compound having a specific structure and not having an aliphatic cyclic structure, (B) an acrylate compound or a methacrylate compound having an aliphatic cyclic structure and not having a structure of Chemical Formula (1), (C) an acid anhydride-modified polybutadiene compound, (D) silica particles, and (E) a polymerization initiator.

9 Claims, 1 Drawing Sheet

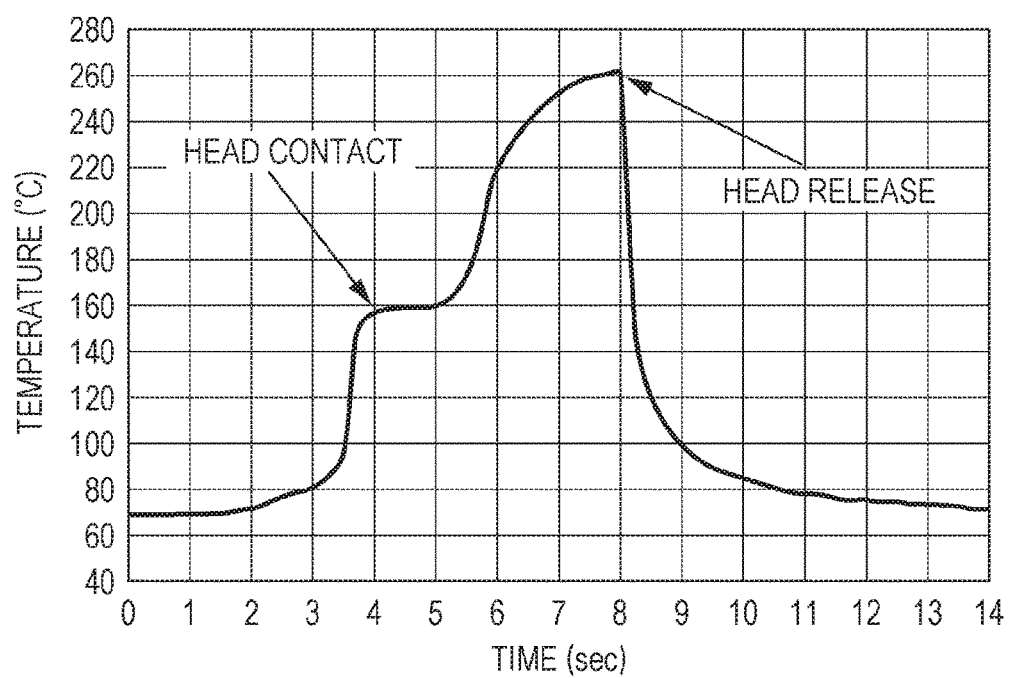

RESIN COMPOSITION AND SEMICONDUCTOR DEVICE

TECHNICAL FIELD

The present invention relates to a resin composition and a semiconductor device. Specifically, the present invention relates to the resin composition suitable for a pre-supply type process used in flip-chip bonding, and the semiconductor device including a cured product of the resin composition.

BACKGROUND ART

In recent years, the flip-chip bonding has been used as a method of mounting a semiconductor chip applicable to further higher density and higher frequency of wiring and the like of the semiconductor device. The flip-chip bonding is a technique of electrically connecting the semiconductor chip and a substrate using bumps (solder balls or the like). Generally, in the flip-chip bonding, a gap between the semiconductor chip and the substrate is sealed with a material called an underfill in order to reinforce around the bump.

Conventionally, in the flip-chip bonding, a method of manufacturing the semiconductor device (hereinafter, referred to as a post-supply type process) has been performed in which the bump of the semiconductor chip and the wiring of the substrate are joined by soldering or the like, and then an underfill agent which is a thermosetting liquid sealing resin composition is injected into a gap between the semiconductor chip and the substrate. In order to make products smaller and more reliable, it is required to narrow the gap. Therefore, in order to narrow the gap, flip-chip mounting using copper pillar for the bump of the semiconductor and a wiring terminal of the substrate has been developed. However, in the post-supply type process, there has been a problem in narrowing the gap.

In recent years, the pre-supply type process has attracted attention. In this process, first, the underfill agent is applied to the substrate and the semiconductor chip is placed thereon. Thereafter, curing of the underfill agent and connection between the bump of the semiconductor chip and the wiring terminal of the substrate are simultaneously performed. Thus, it is possible to shorten the process and shorten a curing time. As a result, it is possible to manufacture the semiconductor device at low cost and low energy. The liquid sealing resin composition (hereinafter, referred to as a pre-supply type liquid sealing resin composition) for the pre-supply type process has been studied.

The present inventors studied improvement of the resin composition (Patent Literature 1) containing (A) a specific EO-modified bisphenol A dimethacrylate, (B) a specific tricyclodecanedimethanol diacrylate, (C) an acid copolymer of butadiene and maleic anhydride, (D) an organic peroxide, and (E) a silica filler, as the resin composition which can be used in the pre-supply type process and has a thermal expansion coefficient relatively lower than that of an epoxy resin. A purpose of this study is to impart further durability to the resin composition while maintaining conventional mounting characteristics.

In the improvement of the above-mentioned resin composition, it has been found that an ultraviolet-curable composition for optical disk characterized by containing a predetermined branched epoxy (meth) acrylate (E1) and that the branched epoxy (meth) acrylate (E1) has a weight average molecular weight of 1,000 to 10,000 by gel permeation chromatography is disclosed (Patent Document 2). The ultraviolet-curable composition is used for a light transmitting layer of the optical disk laminated with at least a light reflecting layer and the light transmitting layer on the substrate and reproducing information by irradiating a laser beam from the light transmitting layer side.

CITATION LIST

Patent Literature

Patent Literature 1: JP-A-2015-017169
Patent Literature 2: WO 2009/063743

SUMMARY OF THE INVENTION

Problems to be Solved by the Invention

However, the ultraviolet-curable composition for optical disk described above has low deformation. Therefore, it was found that various problems arise when this composition is used as the pre-supply type liquid sealing resin composition. The problems are that voids tend to occur during application, the voids and delamination tend to occur after reflow subsequent to a moisture absorption resistance test because durability at high temperatures is poor, and the delamination tends to occur because warpage occurs during curing.

According to an embodiment of the present invention, the above problems can be solved. That is, an object of the present invention is to provide a resin composition in which the voids are suppressed during application, the voids and the delamination are suppressed after the reflow subsequent to the mounting and moisture absorption resistance test, and the delamination and a change in resistance value are suppressed even in a high-temperature durability test, when used in the pre-supply type process.

Solution to the Problems

The present invention relates to the resin composition which solves the above problems by having the following composition, and the semiconductor device.

[1]

[Chemical Formula 1]

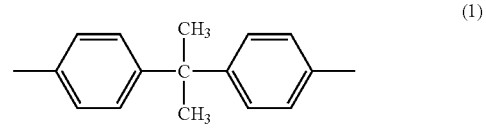

A resin composition containing:
(A) an acrylate compound or methacrylate compound having a structure of Chemical Formula (1) and not having an aliphatic cyclic structure;
(B) an acrylate compound or a methacrylate compound having an aliphatic cyclic structure and not having the structure of Chemical Formula (I);

(C) an acid anhydride-modified polybutadiene compound;
(D) silica particles; and
(E) polymerization initiator.

[2]

[Chemical Formula 2]

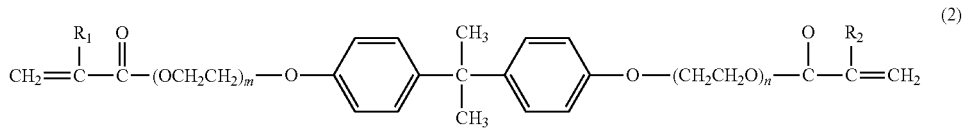

(wherein $R_1$ and $R_2$ may be the same or different and are H or $CH_3$, and m+n is 2 to 30)

[Chemical Formula 3]

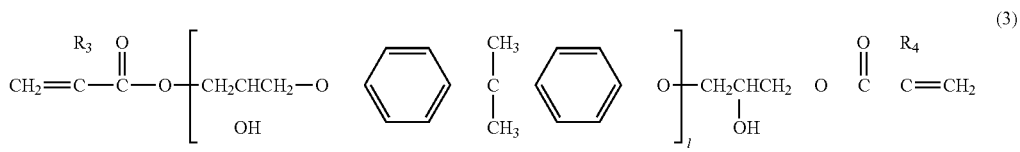

(wherein $R_3$ and $R_4$ may be the same or different and are H or $CH_3$, and l is 1 to 3)

The resin composition according to the above [1], wherein a component (A) contains at least one compound selected from a group consisting of a compound represented by a general formula (2) and a compound represented by a general formula (3).

[3] The resin composition according to the above [1], wherein a component (D) is 20 to 65 parts by mass based on 100 parts by mass of the resin composition.

[4]

[Chemical Formula 4]

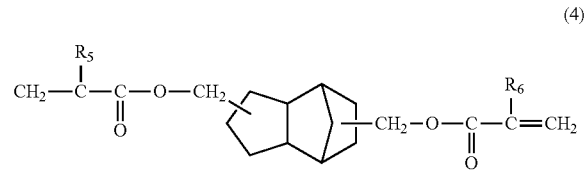

(wherein $R_5$ and $R_6$ may be the same or different and are H or $CH_3$)

The resin composition according to the above [1], in which a component (B) contains a compound represented by a general formula (4).

[5] The resin composition according to the above [2], in which the component (A) contains the compound represented by the general formula (2) and the compound represented by the general formula (3).

[6] The resin composition according to the above [1], in which the component (E) is a radical polymerization initiator.

[7] The resin composition according to the above [1], which is in a liquid state at room temperature.

[8] A pre-supply type liquid sealing agent containing the resin composition according to the above [1].

[9] A cured product of the resin composition according to the above [1].

[10] A semiconductor device including the cured product of the resin composition according to the above [1].

Effects of the Invention

According to the present invention [1], it is possible to provide the resin composition in which the voids are suppressed during application, the voids and the delamination are suppressed after the reflow subsequent to the mounting and moisture absorption resistance test, and the delamination and the change in resistance value are suppressed in the high-temperature durability test, when used in the pre-supply type process.

According to the present invention [8], it is possible to provide a pre-supply type liquid sealing resin composition containing the resin composition in which the voids are suppressed during application, the voids and the delamination are suppressed after the reflow subsequent to the mounting and moisture absorption resistance test, and the delamination and the change in resistance value are suppressed in the high-temperature durability test. According to the present invention [9], it is possible to provide the cured product of the resin in which the voids, the delamination, and the change in resistance value are suppressed, when used in the pre-supply type process. According to the present invention [10], it is possible to provide a highly reliable semiconductor device including the cured product of the resin in which the voids, the delamination, and the change in resistance value are suppressed, when used in the pre-supply type process.

BRIEF DESCRIPTION OF THE DRAWINGS

FIG. 1 is a TCB temperature profile set when thermal compression bonding (TCB) was performed in Examples and Comparative Examples.

DESCRIPTION OF THE EMBODIMENTS

[Resin Composition]

A resin composition of the present invention (hereinafter referred to as a resin composition) contains the following (A) to (E).

[Chemical Formula 5]

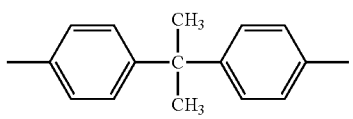
(1)

(A) an acrylate compound or methacrylate compound having a structure of Chemical Formula (1) and not having an aliphatic cyclic structure,
(B) an acrylate compound or a methacrylate compound having an aliphatic cyclic structure and not having the structure of Chemical Formula (1),
(C) an acid anhydride-modified polybutadiene compound,
(D) silica particles, and
(E) polymerization initiator.

A component (A) is an acrylate compound or a methacrylate compound having a structure of Chemical Formula (1) and not having an aliphatic cyclic structure.

[Chemical Formula 6]

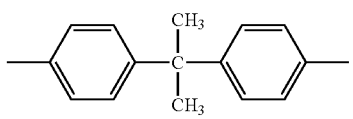
(1)

The component (A) imparts curability, heat resistance, and adhesiveness to the resin composition, and imparts durability to the resin composition after curing.

The component (A) is preferably EO-modified bisphenol A dimethacrylate, more preferably bisphenol A type epoxy acrylate. Here, EO modification means having a block structure of an ethylene oxide unit (—$CH_2$—$CH_2$—O—).

The component (A) further preferably contains at least one compound selected from a group consisting of a compound represented by a general formula (2) and a compound represented by a general formula (3) from viewpoints of liquid properties, adhesion after curing, and durability.

(wherein $R_3$ and $R_4$ may be the same or different and are H or $CH_3$, and l is 1 to 3)

The compound represented by the general formula (3) is epoxy acrylate. Particularly preferably, the component (A) contains the compound represented by the general formula (2) and the compound represented by the general formula (3). Examples of commercially available products include EO-modified bisphenol A dimethacrylate (m+n=2.3 in the general formula (2), product name: BPE-80N) manufactured by Shin-Nakamura Chemical Co., Ltd., EO-modified bisphenol A dimethacrylate (m+n=30 in the general formula (2), product name: BPE-1300N) manufactured by Shin-Nakamura Chemical Co., Ltd., EO-modified bisphenol A dimethacrylate (m+n=4 in the general formula (2), product name: BPE-200) manufactured by Shin-Nakamura Chemical Co., Ltd., EO-modified bisphenol A acrylate (m+n=4 in the general formula (2), product name: A-BPE-4) manufactured by Shin-Nakamura Chemical Co., Ltd., and bisphenol A diacrylate (product name: Viscoat #540) manufactured by Osaka Organic Chemical Industry Ltd. A single component (A) can be used. Alternatively, two or more kinds of the component (A) may be used in combination.

The acrylate compound or the methacrylate compound having an aliphatic cyclic structure which is a component (B) and not having the structure of Chemical Formula (1) imparts durability after high-temperature storage to the resin composition after curing.

From a viewpoint of imparting liquid properties and curability, a preferred component (B) is dimethylol tricyclodecane diacrylate represented by chemical formula (4).

[Chemical Formula 9]

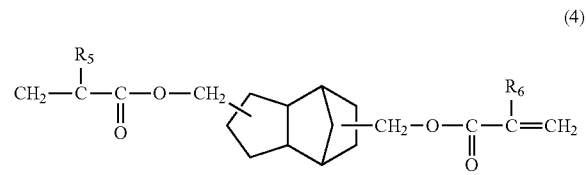
(4)

(wherein $R_5$ and $R_6$ may be the same or different and are H or $CH_3$)

[Chemical Formula 7]

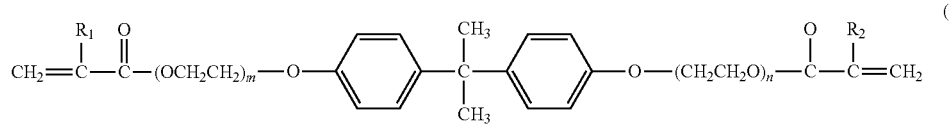
(2)

(wherein $R_1$ and $R_2$ may be the same or different and are H or $CH_3$, and m+n is 2 to 30, preferably 2.3 to 4.0)

[Chemical Formula 8]

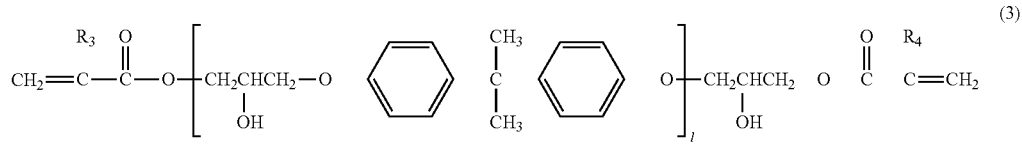
(3)

A single component (B) can be used. Alternatively, two or more kinds of the component (B) may be used in combination.

The acid anhydride-modified polybutadiene compound which is a component (C) imparts stress relaxation performance to the resin composition and prevents the delamination and the like. The component (C) is preferably liquid at room temperature. Examples of commercially available products of the component (C) include acid anhydride-modified polybutadiene (product name: Ricon130MA8) manufactured by Total Cray Valley, and acid anhydride modified polybutadiene (product name: Ricon130MA13) manufactured by Total Cray Valley. Incidentally, polybutadiene not modified with anhydride, for example, polybutadiene containing at least one of a structure represented by the following Chemical Formula (5) or a structure represented by Chemical Formula (6) and having a number average molecular weight of 1000 to 6000, or polybutadiene (product name: Ricon130) manufactured by TOMOE Engineering Co., Ltd. as a commercially available product, is low compatible with the resin composition.

[Chemical Formula 10]

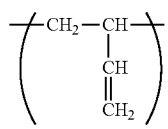

(5)

The structure represented by Chemical Formula (5) or the structure represented by Chemical Formula (6)

[Chemical Formula 11]

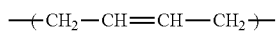

(6)

Therefore, when such a compound is contained in the resin composition, the voids tend to occur during mounting. Here, the number average molecular weight is a value obtained by gel permeation chromatography (GPC) using a calibration curve with standard polystyrene. A single component (C) can be used. Alternatively, two or more kinds of the component (C) may be used in combination.

An elastic modulus and a thermal expansion coefficient of the resin composition after curing are adjusted with a silica filler which is a component (D). The component (D) may be subjected to a surface treatment such as hydrophobicity or hydrophilicity. Examples of the component (D) include colloidal silica, hydrophobic silica, fine silica, and nanosilica. An average particle diameter of the component (D) (average maximum diameter when not being spherical) is not particularly limited. However, in order to uniformly disperse the silica filler in the resin composition, the average particle diameter of the component (D) is preferably 0.05 to 1 µm. When the average particle diameter is less than 0.05 µm, viscosity of the resin composition increases during mounting, and fluidity thereof may be deteriorated. When the average particle diameter exceeds 1 µm, it may be difficult to uniformly disperse the silica filler in the resin composition. Examples of commercially available products of the component (D) include silica particles (product name: SO-E2, average particle diameter: 0.5 µm) manufactured by Admatechs Co., Ltd. and silica particles (product name: Sciqas0.4 µm, average particle diameter: 0.4 µm; product name: Sciqas 0.1 µm, average particle diameter: 0.1 µm; product name: Saiqus 1 µm, average particle diameter: 1 µm) manufactured by Sakai Chemical Industry Co., Ltd. Here, the average particle diameter of the component (D) is measured by a dynamic light scattering Nanotrac particle size analyzer. A single component (D) can be used. Alternatively, two or more kinds of the component (D) may be used in combination.

The polymerization initiator which is a component (E) may have a curing ability of the component (A). From a viewpoint of photocurability, the component (E) is preferably a radical polymerization initiator. From a viewpoint of work life, the component (E) is preferably an organic peroxide, more preferably dicumyl peroxide, or tert-butyl α-cumyl peroxide. Examples of commercially available products of the component (E) include organic peroxides (tert-butyl peroxybenzoate, product name: Perbutyl Z; dicumyl peroxide, product name: Percumyl D, and tert-butyl α-cumyl peroxide, product name: Perbutyl C) manufactured by NOF CORPORATION. A single component (E) can be used. Alternatively, two or more kinds of the component (E) may be used in combination.

The component (A) is preferably 11 to 27 parts by mass based on 100 parts by mass of the resin composition.

The component (B) is preferably 8 to 27 parts by mass based on 100 parts by mass of the resin composition.

The component (C) is preferably 1 to 7 parts by mass based on 100 parts by mass of the resin composition.

The component (D) is preferably 20 to 65 parts by mass based on 100 parts by mass of the resin composition.

The component (E) is preferably 0.05 to 0.60 parts by mass based on 100 parts by mass of the resin composition.

From a viewpoint of adhesiveness of the resin composition, preferably, the resin composition further contains (F) silane coupling agent. More preferably, a component (F) contains an epoxy group or a (meth)acrylate group. Examples of commercially available products of the component (F) include silane coupling agents (3-glycidoxypropyltrimethoxysilane, product name: KBM503, 3-acryloxypropyltrimethoxysilane, product name: KBM5103, and 3-methacryloxypropyltrimethoxysilane, product name: KBM403) manufactured by Shin-Etsu Chemical Co., Ltd.

The component (F) is preferably 0.1 to 1.0 part by mass based on 100 parts by mass of the resin composition.

The resin composition can be further suitably blended with, for example, the following additives, if necessary, to the extent that an object of the present invention is not impaired.

Epoxy resin (both liquid and solid can be used), epoxy resin curing agent, and epoxy resin curing accelerator Rheology control agent (can be used for adjusting coating suitability and flowability)

Dispersant, antisettling agent (can be used for improving dispersibility of filler and colorant and for preventing settling)

Anti-foaming agent (can be used for adjusting defoaming property)

Coloring agent (can be used for coloring)

Surface conditioner (can be used for adjusting surface condition and wettability)

Elastomers (can be used for adjusting elastic modulus and stress)

Solid resin (can be used as a composition for adjusting viscosity, toughness and the like within a range capable of maintaining a liquid state)

Fluxing agent

Polymerization retarder or polymerization inhibitor

The resin composition can be obtained, for example, by stirring, melting, mixing, or dispersing the components (A) to (E), other additives and the like at the same time or separately, optionally with heat treatment. Devices for mixing, stirring, dispersion or the like are not particularly limited. For example, it is possible to use a mortar machine equipped with a stirring device and a heating device, or a three-roll mill, a ball mill, a planetary mixer, or a bead mill. Further, these machines may be used in combination as appropriate.

From viewpoints of dispensability and printability, the resin composition is preferably liquid at room temperature. Here, the room temperature means 25° C.

Preferably, the resin composition is cured at 180 to 300° C. for 2 to 30 seconds. From a viewpoint of productivity improvement, particularly preferably, it is cured within 15 seconds.

The resin composition of the present invention is particularly suitable for a liquid sealant used in a pre-supply type process.

[Semiconductor Device]

A semiconductor device of the present invention includes a cured product of the above-described resin composition. The semiconductor device may be any device including a semiconductor chip having bumps and a substrate having wiring. An example of such a semiconductor device is a flip-chip NCP mounted device. In this case, protruding electrodes are formed on both of the bump of the semiconductor chip and a connecting portion of the wiring of the substrate. Therefore, a solder layer may be formed on a tip of the bump and/or the wiring of the substrate.

EXAMPLES

The present invention will be described with reference to examples. However, the present invention is not limited thereto. In the following examples, parts and percentages are by mass unless otherwise indicated.

As the component (A), BPE-80N (EO-modified bisphenol A dimethacrylate manufactured by Shin-Nakamura Chemical Co., Ltd., m+n=2.3 in the general formula (2)), BPE-1300N (EO-modified bisphenol A dimethacrylate manufactured by Shin-Nakamura Chemical Co., Ltd., m+n=30 in the general formula (2)), BPE-200 (EO-modified bisphenol A dimethacrylate manufactured by Shin-Nakamura Chemical Co., Ltd., m+n=4 in the general formula (2)), A-BPE-4 (EO-modified bisphenol A diacrylate manufactured by Shin-Nakamura Chemical Co., Ltd., m+n=4 in the general formula (2)), and Viscoat #540 (bisphenol A diacrylate manufactured by Osaka Organic Chemical Industry Ltd.) were used. As the component (B), A-DCP (tricyclodecanedimethanol diacrylate manufactured by Shin-Nakamura Chemical Co., Ltd.) and DCP (tricyclodecanedimethanol dimethacrylate manufactured by Shin-Nakamura Chemical Co., Ltd.) were used. As the component (B'), Light Acrylate NP-A (neopentyl glycol diacrylate manufactured by Kyoeisha Chemical Co., Ltd.) was used. As the component (C), Ricon130MA8 (acid anhydride modified polybutadiene manufactured by Total Cray Valley) and Ricon130MA13 (acid anhydride modified polybutadiene manufactured by Total Cray Valley) were used. As the component (C'), Ricon130 (polybutadiene manufactured by Total Cray Valley) was used. As the component (D), SO-E2 (silica particles manufactured by Admatechs Co., Ltd., average particle diameter: 0.5 µm) and Sciqas 0.4 µm (silica particles manufactured by Sakai Chemical Industry Co., Ltd., average particle diameter: 0.4 µm) were used. As the component (E), Perbutyl C (polymerization initiator manufactured by NOF CORPORATION), Perbutyl Z (polymerization initiator manufactured by NOF CORPORATION), and Percumyl D (polymerization initiator manufactured by NOF CORPORATION) were used. As the component (F), KBM503 (silane coupling agent, 3-glycidoxypropyltrimethoxysilane manufactured by Shin-Etsu Chemical Co., Ltd.), KBM5103 (silane coupling agent, 3-acryloxypropyltrimethoxysilane manufactured by Shin-Etsu Chemical Co., Ltd.), and KBM403 (silane coupling agent, 3-methacryloxypropyltrimethoxysilane manufactured by Shin-Etsu Chemical Co., Ltd.) were used.

Examples 1 to 18, Comparative Examples 1 to 5

With formulations shown in Tables 1 to 3, the components (A) to (F) were mixed using the three-roll mill to prepare the resin composition.

[Initial Evaluation]

<<Preparation of Test Piece>>

A test silicon chip (Si size: 7.3 mm×7.3 mm×0.125 mm thick, bump size: solder layer formed on a Cu pillar of 30 µm×30 µm×30 µm, number of bumps: 544) and an organic substrate (substrate size: 187.5 mm×64.0 mm×0.36 mm thick, electrode: OSP (Organic Solderability Preservative) treated Cu pillar) for mounting the test chip were used. Shapes of the silicon chip and the Cu pillar were cubes. When the test silicon chip and the substrate are joined using flux, a value between resistance value measurement pads was 28 to 32Ω. When a connection surface between the test silicon chip and the substrate was observed, sufficient solder wetting was confirmed in all the bumps. Therefore, this value was taken as a reference value.

The prepared resin composition was applied on the organic substrate in an X pattern with a 23G size needle using a dispenser (model number: SuperΣCM II V5) manufactured by Musashi Engineering Co., Ltd.

The test chip and the organic substrate were thermal compression bonded (TCB) using a flip chip bonder (model number: FCB3) manufactured by Panasonic Factory Solutions Co., Ltd. Thus, the resin composition was cured, and the Cu pillar of the test chip and the Cu pillar of the organic substrate were connected by soldering. A stage temperature of the flip chip bonder at this time was set at 70° C. A load was set to 25 N. FIG. 1 shows a set thermal compression bonding (TCB) temperature profile. The TCB profile is a temperature history measured with a thermocouple (50 umφ) inserted between the test chip and the organic substrate. A test piece after TCB was heated at 165° C. for 1 hour to cure the resin composition. Five test pieces were prepared for each example and comparative example.

<<Void/Delamination>>

An occurrence state of void/delamination of the prepared test piece was checked by a reflection method using an ultrasonic flaw detector. A case where white shadows were not seen on all the five test pieces on their images was evaluated as "Good". A case where a white shadow was seen in even one of the five test pieces on their images was evaluated as "Poor". Tables 1 to 3 show the results.

<<Resistance Value>>

A resistance value of the prepared test piece was measured with the resistance value measurement pads. A case where the resistance value was 28 to 32Ω was evaluated as "Good". A case where the resistance value was a resistance value other than 28 to 32Ω was evaluated as "Poor". Tables 1 to 3 show the results.

[Moisture Absorption Reflow Test]
<<Preparation of Test Piece>>

The test pieces (five test pieces) prepared for checking an initial mounting appearance was placed in a thermo-hygrostat bath and left for 192 hours under the condition of 30° C./60% RH to absorb moisture (corresponding to JEDEC standard, moisture absorption condition Level 3). Thereafter, the test pieces were passed three times through a reflow furnace at a maximum reaching temperature of 260° C. Tables 1 to 3 show the results.

<<Void/Delamination, Resistance Value>>
They are evaluated like the initial evaluation. Tables 1 to 3 show the results.

[High-Temperature Storage Test]
<<Preparation of Test Piece>>

The test pieces (five test pieces) subjected to the moisture absorption reflow test were heated at 150° C. for 500 hours.

<<Void/Delamination, Resistance Value>>
They are evaluated like the initial evaluation. Tables 1 to 3 show the results.

TABLE 1

|  |  | Example 1 | Example 2 | Example 3 | Example 4 | Example 5 | Example 6 | Example 7 | Example 8 | Example 9 |
|---|---|---|---|---|---|---|---|---|---|---|
| Component (A) | BPE-80N | 13.94 | 0 | 0 | 0 | 13.94 | 13.94 | 13.94 | 13.94 | 13.94 |
|  | BPE-1300N | 0 | 13.94 | 0 | 0 | 0 | 0 | 0 | 0 | 0 |
|  | BPE-200 | 0 | 0 | 13.94 | 0 | 0 | 0 | 0 | 0 | 0 |
|  | A-BPE-4 | 0 | 0 | 0 | 13.94 | 0 | 0 | 0 | 0 | 0 |
|  | Viscoat#540 | 5.98 | 5.98 | 5.98 | 5.98 | 5.98 | 5.98 | 5.98 | 5.98 | 5.98 |
| Component (B) | A-DCP | 23.90 | 23.90 | 23.90 | 23.90 | 23.90 | 23.90 | 23.90 | 23.90 | 23.90 |
|  | DCP | 0 | 0 | 0 | 0 | 0 | 0 | 0 | 0 | 0 |
| Component (B') | Light Acrylate P-A | 0 | 0 | 0 | 0 | 0 | 0 | 0 | 0 | 0 |
| Component (C) | Ricon 130MA8 | 2.99 | 2.99 | 2.99 | 2.99 | 0 | 2.99 | 2.99 | 2.99 | 2.99 |
|  | Ricon 130MA13 | 0 | 0 | 0 | 0 | 2.99 | 0 | 0 | 0 | 0 |
| Component (C') | Ricon 130 | 0 | 0 | 0 | 0 | 0 | 0 | 0 | 0 | 0 |
| Component (D) | SO-E2 | 52.79 | 52.79 | 52.79 | 52.79 | 52.79 | 52.79 | 52.79 | 53.09 | 52.79 |
|  | Sciqas | 0 | 0 | 0 | 0 | 0 | 0 | 0 | 0 | 0 |
| Component (E) | Perbutyl C | 0.10 | 0.10 | 0.10 | 0.10 | 0.10 | 0 | 0 | 0.10 | 0.10 |
|  | Perbutyl Z | 0 | 0 | 0 | 0 | 0 | 0.10 | 0 | 0 | 0 |
|  | Percumyl D | 0 | 0 | 0 | 0 | 0 | 0 | 0.10 | 0 | 0 |
| Component (F) | KBM503 | 0.30 | 0.30 | 0.30 | 0.30 | 0.30 | 0.30 | 0.30 | 0 | 0 |
|  | KBM5103 | 0 | 0 | 0 | 0 | 0 | 0 | 0 | 0 | 0.30 |
|  | KBM403 | 0 | 0 | 0 | 0 | 0 | 0 | 0 | 0 | 0 |
| Total |  | 100.00 | 100.00 | 100.00 | 100.00 | 100.00 | 100.00 | 100.00 | 100.00 | 100.00 |
| Initial stage | Void/delamination | Good | Good | Good | Good | Good | Good | Good | Good | Good |
|  | Resistance value | Good | Good | Good | Good | Good | Good | Good | Good | Good |
| Moisture absorption reflow (30° C./60% RH × 192 hours) | Void/delamination | Good | Good | Good | Good | Good | Good | Good | Good | Good |
|  | Resistance value | Good | Good | Good | Good | Good | Good | Good | Good | Good |
| High-temperature storage (150° C. × 500 hours) | Void/delamination | Good | Good | Good | Good | Good | Good | Good | Good | Good |
|  | Resistance value | Good | Good | Good | Good | Good | Good | Good | Good | Good |

TABLE 2

|  |  | Example 10 | Example 11 | Example 12 | Example 13 | Example 14 | Example 15 | Example 16 | Example 17 | Example 18 |
|---|---|---|---|---|---|---|---|---|---|---|
| Component (A) | BPE-80N | 13.94 | 13.94 | 19.92 | 0 | 23.79 | 10.41 | 5.91 | 31.09 | 22.21 |
|  | BPE-1300N | 0 | 0 | 0 | 0 | 0 | 0 | 0 | 0 | 0 |
|  | BPE-200 | 0 | 0 | 0 | 0 | 0 | 0 | 0 | 0 | 0 |
|  | A-BPE-4 | 0 | 0 | 0 | 0 | 0 | 0 | 0 | 0 | 0 |
|  | Viscoat#540 | 5.98 | 5.98 | 0 | 5.98 | 10.14 | 4.43 | 2.54 | 13.33 | 22.21 |
| Component (B) | A-DCP | 23.90 | 0 | 23.90 | 37.84 | 40.51 | 17.72 | 28.77 | 20.71 | 20.71 |
|  | DCP | 0 | 23.90 | 0 | 0 | 0 | 0 | 0 | 0 | 0 |

TABLE 2-continued

|  |  | Example 10 | Example 11 | Example 12 | Example 13 | Example 14 | Example 15 | Example 16 | Example 17 | Example 18 |
|---|---|---|---|---|---|---|---|---|---|---|
| Component (B') | Light Acrylate NP-A | 0 | 0 | 0 | 0 | 0 | 0 | 0 | 0 | 0 |
| Component (C) | Ricon 130MA8 | 2.99 | 2.99 | 2.99 | 2.99 | 5.06 | 2.12 | 2.43 | 4.33 | 4.33 |
|  | Ricon 130MA13 | 0 | 0 | 0 | 0 | 0 | 0 | 0 | 0 | 0 |
| Component (C') | Ricon 130 | 0 | 0 | 0 | 0 | 0 | 0 | 0 | 0 | 0 |
| Component (D) | SO-E2 | 52.79 | 52.79 | 52.79 | 0 | 20.00 | 65.00 | 60.00 | 30.00 | 30.00 |
|  | Sciqas | 0 | 0 | 0 | 52.79 | 0 | 0 | 0 | 0 | 0 |
| Component (E) | Perbutyl C | 0.10 | 0 | 0.10 | 0.10 | 0 | 0 | 0 | 0 | 0 |
|  | Perbutyl Z | 0 | 0.20 | 0 | 0 | 0.10 | 0.10 | 0.10 | 0.10 | 0.10 |
|  | Percumyl D | 0 | 0 | 0 | 0 | 0 | 0 | 0 | 0 | 0 |
| Component (F) | KBM503 | 0 | 0.30 | 0.30 | 0.30 | 0.40 | 0.22 | 0.25 | 0.44 | 0.44 |
|  | KBM5103 | 0 | 0 | 0 | 0 | 0 | 0 | 0 | 0 | 0 |
|  | KBM403 | 0.30 | 0 | 0 | 0 | 0 | 0 | 0 | 0 | 0 |
| Total |  | 100.00 | 100.00 | 100.00 | 100.00 | 100.00 | 100.00 | 100.00 | 100.00 | 100.00 |
| Initial stage | Void/delamination | Good | Good | Good | Good | Good | Good | Good | Good | Good |
|  | Resistance value | Good | Good | Good | Good | Good | Good | Good | Good | Good |
| Moisture absorption reflow (30° C./60% RH × 192 hours) | Void/delamination | Good | Good | Good | Good | Good | Good | Good | Good | Good |
|  | Resistance value | Good | Good | Good | Good | Good | Good | Good | Good | Good |
| High-temperature storage (150° C. × 500 hours) | Void/delamination | Good | Good | Good | Good | Good | Good | Good | Good | Good |
|  | Resistance value | Good | Good | Good | Good | Good | Good | Good | Good | Good |

TABLE 3

|  |  | Comparative Example 1 | Comparative Example 2 | Comparative Example 3 | Comparative Example 4 | Comparative Example 5 |
|---|---|---|---|---|---|---|
| Component (A) | BPE-80N | 13.94 | 13.94 | 14.04 | 29.74 | 0 |
|  | BPE-1300N | 0 | 0 | 0 | 0 | 0 |
|  | BPE-200 | 0 | 0 | 0 | 0 | 0 |
|  | A-BPE-4 | 0 | 0 | 0 | 0 | 0 |
|  | Viscoat#540 | 5.98 | 5.98 | 5.98 | 12.68 | 0 |
| Component (B) | A-DCP | 0 | 23.90 | 23.90 | 50.62 | 37.22 |
|  | DCP | 0 | 0 | 0 | 0 | 0 |
| Component (B') | Light Acrylate NP-A | 23.90 | 0 | 0 | 0 | 0 |
| Component (C) | Ricon 130MA8 | 2.99 | 0 | 2.99 | 6.33 | 2.43 |
|  | Ricon 130MA13 | 0 | 0 | 0 | 0 | 0 |
| Component (C') | Ricon 130 | 0 | 2.99 | 0 | 0 | 0 |
| Component (D) | SO-E2 | 52.79 | 52.79 | 52.79 | 0 | 60.00 |
|  | Sciqas | 0 | 0 | 0 | 0 | 0 |
| Component (E) | Perbutyl C | 0.10 | 0.10 | 0 | 0 | 0 |
|  | Perbutyl Z | 0 | 0 | 0 | 0.10 | 0.10 |
|  | Percumyl D | 0 | 0 | 0 | 0 | 0 |
| Component (F) | KBM503 | 0.30 | 0.30 | 0.30 | 0.53 | 0.25 |
|  | KBM5103 | 0 | 0 | 0 | 0 | 0 |
|  | KBM403 | 0 | 0 | 0 | 0 | 0 |
| Total |  | 100.00 | 100.00 | 100.00 | 100.00 | 100.00 |
| Initial stage | Void/delamination | Good | Poor | Poor | Poor | Poor |
|  | Resistance value | Good | Good | Poor | Good | Good |
| Moisture absorption reflow (30° C./60% RH × 192 hours) | Void/delamination | Good | Not evaluated | Not evaluated | Not evaluated | Not evaluated |
|  | Resistance value | Good | Not evaluated | Not evaluated | Not evaluated | Not evaluated |
| High-temperature storage (150° C. × 500 hours) | Void/delamination | Poor | Not evaluated | Not evaluated | Not evaluated | Not evaluated |
|  | Resistance value | Poor | Not evaluated | Not evaluated | Not evaluated | Not evaluated |

In summary of the test results, in all of Examples 1 to 18, the void/delamination was not observed at the initial stage, after moisture absorption reflow and after high-temperature storage. Therefore, the resistance value was within a desired value range. In contrast, in Comparative Example 1 not containing the component (B), the void/delamination was observed after being left at high temperature. Therefore, the resistance value was out of the desired value range. In Comparative Example 2 not containing the component (C), the void/delamination was observed at an initial stage. In Comparative Example 3 not containing the component (E), the void/delamination was observed at the initial stage. Therefore, the resistance value was out of the desired value range. In Comparative Example 4 not containing the component (D), the void/delamination was observed at the initial stage. In Comparative Example 5 not containing the component (A), the void/delamination was observed at the initial stage.

According to the resin composition of the present invention, the voids are suppressed during application, the voids and delamination are suppressed after reflow subsequent to the moisture absorption resistance test, and the delamination after curing are suppressed, when used in the pre-supply type process. Therefore, it is very useful.

The invention claimed is:

1. A resin composition comprising:
    (A) an acrylate compound or methacrylate compound having a structure of Chemical Formula (1) and not having an aliphatic cyclic structure;

[Chemical Formula 12]

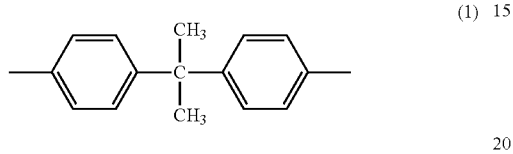

(1)

(B) an acrylate compound or a methacrylate compound having an aliphatic cyclic structure and not having the structure of Chemical Formula (1);
(C) an acid anhydride-modified polybutadiene compound;
(D) silica particles; and
(E) polymerization initiator,
wherein the resin composition is in a liquid state at room temperature.

2. The resin composition according to claim 1, wherein a component (A) comprises at least one compound selected from a group consisting of a compound represented by a general formula (2)

[Chemical Formula 13]

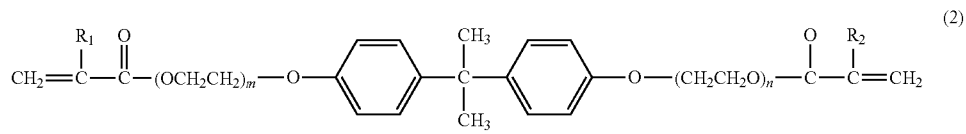

(2)

(wherein $R_1$ and $R_2$ may be the same or different and are H or $CH_3$, and m+n is 2 to 30) and a compound represented by a general formula (3)

[Chemical Formula 14]

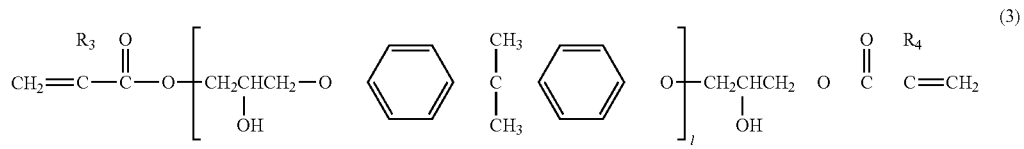

(3)

(wherein $R_3$ and $R_4$ may be the same or different and are H or $CH_3$, and l is 1 to 3).

3. The resin composition according to claim 1, wherein a component (D) is 20 to 65 parts by mass based on 100 parts by mass of the resin composition.

4. The resin composition according to claim 1, wherein a component (B) contains a compound represented by a general formula (4)

[Chemical Formula 15]

(4)

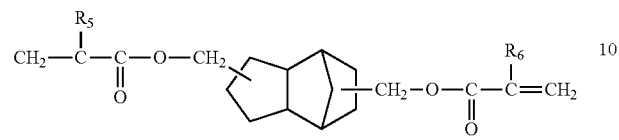

(wherein $R_5$ and $R_6$ may be the same or different and are H or $CH_3$).

5. The resin composition according to claim 2, wherein the component (A) contains the compound represented by the general formula (2) and the compound represented by the general formula (3).

6. The resin composition according to claim 1, wherein a component (E) is a radical polymerization initiator.

7. A liquid sealing agent for a pre-supply process, comprising the resin composition according to claim 1.

8. A cured product of the resin composition according to claim 1.

9. A semiconductor device comprising a cured product of the resin composition according to the claim 1.

* * * * *